(12) United States Patent
van der Avoort et al.

(10) Patent No.: US 8,902,022 B2
(45) Date of Patent: Dec. 2, 2014

(54) RESONATOR AND METHOD OF CONTROLLING THE SAME

(75) Inventors: Casper van der Avoort, Waalre (NL); Andreas Bernardus Maria Jansman, Nuenen (NL)

(73) Assignee: NXP, B.V., Eindhoven (NL)

( * ) Notice: Subject to any disclaimer, the term of this patent is extended or adjusted under 35 U.S.C. 154(b) by 299 days.

(21) Appl. No.: 13/430,275

(22) Filed: Mar. 26, 2012

(65) Prior Publication Data

US 2012/0249265 A1 Oct. 4, 2012

(30) Foreign Application Priority Data

Mar. 28, 2011 (EP) ..................................... 11160031

(51) Int. Cl.
*H03H 9/02* (2006.01)
*H03H 9/24* (2006.01)

(52) U.S. Cl.
CPC . *H03H 9/02259* (2013.01); *H03H 2009/02488* (2013.01); *H03H 9/02433* (2013.01); *H03H 2009/02251* (2013.01); *H03H 9/2452* (2013.01)
USPC ......................................................... 333/186

(58) Field of Classification Search
USPC ......................................................... 333/186
See application file for complete search history.

(56) References Cited

U.S. PATENT DOCUMENTS

| 6,275,122 | B1 | 8/2001 | Speidell et al. |
| 6,429,755 | B2 | 8/2002 | Speidell et al. |
| 6,452,465 | B1 | 9/2002 | Brown et al. |
| 6,624,726 | B2 | 9/2003 | Niu et al. |
| 6,707,351 | B2 | 3/2004 | Gorrell |
| 6,784,766 | B2 | 8/2004 | Allison et al. |
| 6,940,370 | B2 | 9/2005 | Bircumshaw et al. |
| 7,002,436 | B2 | 2/2006 | Ma et al. |
| 7,205,867 | B2 | 4/2007 | Lutz et al. |
| 7,227,432 | B2 | 6/2007 | Lutz et al. |
| 7,319,372 | B2 | 1/2008 | Pan et al. |

(Continued)

FOREIGN PATENT DOCUMENTS

| CN | 101861700 A | 10/2010 |
| JP | 2009-100009 A | 5/2009 |

(Continued)

OTHER PUBLICATIONS

"RF MEMS", retrieved from the Internet at www.mems.sandia.gov/about/rf-mems.html on Feb. 27, 2012, 2 pgs. (2008).

(Continued)

*Primary Examiner* — Stephen Jones
*Assistant Examiner* — Scott S Outten

(57) ABSTRACT

A resonator comprising a resonator body and actuation electrodes for driving the resonator into a resonant mode, in which the resonator body vibrates parallel to a first axis. The resonator comprises means to apply a voltage to the resonator in a direction perpendicular to the first axis direction. This serves to shift the frequency of resonant modes other than the principal resonant mode, and this allows increased amplitude of output signal from the resonator.

15 Claims, 6 Drawing Sheets

(56) References Cited

U.S. PATENT DOCUMENTS

| | | | |
|---|---|---|---|
| 7,517,711 | B2 | 4/2009 | Naniwada |
| 7,579,662 | B2 | 8/2009 | Tanaka |
| 7,595,708 | B2 | 9/2009 | Lutz et al. |
| 7,612,635 | B2 | 11/2009 | Huang |
| 7,633,360 | B2 | 12/2009 | Weigold |
| 7,843,283 | B2 | 11/2010 | Reichenbach et al. |
| 8,269,578 | B2 | 9/2012 | Phan Le et al. |
| 2004/0113722 | A1 | 6/2004 | Bircumshaw |
| 2006/0071578 | A1 | 4/2006 | Drabe et al. |
| 2009/0056443 | A1* | 3/2009 | Netzer ............... 73/504.12 |
| 2009/0322448 | A1* | 12/2009 | Bhave et al. ............ 333/186 |
| 2010/0232623 | A1* | 9/2010 | Martin et al. ............ 381/96 |
| 2011/0127625 | A1 | 6/2011 | van der Avoort et al. |
| 2011/0163817 | A1 | 7/2011 | Nakamura |

FOREIGN PATENT DOCUMENTS

| | | | |
|---|---|---|---|
| JP | 2009-118331 | A | 5/2009 |
| WO | 2004/053431 | A2 | 6/2004 |
| WO | 2010/116332 | A1 | 10/2010 |
| WO | 2010/143363 | A1 | 12/2010 |

OTHER PUBLICATIONS

Kaajakari, V., et al.; "Nonlinear Limits for Single Crystal Silicon Microresonators"; J. of Microelectromechanical Systems, vol. 13, No. 5, pp. 715-724 (2004).

Hsu, W.T.; "Vibrating RF MEMS for Timing Frequency References"; IEEE MTT-S Int'l Microwave Symposium Digest, pp. 672-675 (2006).

Abdolvand, R., et al.; "Enhanced Power Handling and Quality Factor in Thin-Film Piezoelectricon-Substrate Resonators," IEEE Ultrasonics Symp. 2007, pp. 608-611 (2007).

Bontemps, J. J. M., et al.; "56 MHz Piezoresistive Micromechanical Oscillator," Solid-State Sensors, Actuators and Microsystems Conf., Transducers 2009, pp. 1433-1436 (Jun. 21, 2009).

Lin, A. H., et al.; "Methods for Enhanced Electrical Transduction and Characterization of Micromechanical Resonators," Sensors and Actuators A, vol. 158, No. 2, pp. 263-272 (Mar. 1, 2010).

Van der Avoort, C., et al.; "Amplitude Saturation of MEMS Resonators Explained by Autoparametric Resonance"; J. Micromech. Microeng. 20 105012, 15 pgs. (2010).

Extended European Search Report for European patent appln. No. 11160031.8 (Sep. 14, 2011).

* cited by examiner

RESONATOR AND METHOD OF CONTROLLING THE SAME

CROSS-REFERENCE TO RELATED APPLICATIONS

This application claims the priority under 35 U.S.C. §119 of European patent application no. 11160031.8, filed on Mar. 28, 2011, the contents of which are incorporated by reference herein.

This invention relates to resonators, for example MEMS resonators.

In various products MEMS resonators are replacing quartz resonators as reference timing devices; they serve as reference resonators in oscillator circuits or as clocking reference to synchronise operations in digital circuitry. MEMS resonators offer the advantage of small dimensions (especially the small height is considered an advantage) with low-cost fabrication. In another application, MEMS resonators can also be combined to form a high-quality filter.

In oscillator circuits, the most important demands on the MEMS resonator are:

(i) a stable resonance frequency
(ii) a high quality factor, to minimise the contribution of the MEMS resonator to the phase noise of the oscillator, and
(iii) a non-distorted large amplitude output signal to give a high signal-to-noise ratio of the oscillator and for a linear oscillator output.

If employed in a filter, MEMS resonators should meet the same demands for different reasons:

(i) a stable resonance frequency to have stable filter operation
(ii) a high quality factor to give a low insertion loss, and
(iii) non-distorted large amplitude output signal, to give a large dynamic range.

This invention aims to improve on the third of these requirements.

MEMS resonators exhibit a limit to the amplitude of the resonant oscillations which is below that which would be expected from the mechanical design. The origin of this limitation has only been fully understood very recently, and relates to the transfer of energy from the desired mode of vibration (eigenmode) to other eigenmodes.

According to the invention, there is provided a resonator comprising a resonator body and an actuation electrode for driving the resonator into a resonant mode, in which the resonator body vibrates parallel to a first axis; a detection arrangement for detecting the vibration in the first axis direction and generating an electrical output signal derived from the vibration, wherein the resonator comprises means (86) to apply a bias voltage to the resonator body, using at least one bias electrode (86) separated from the resonator body by a non-conductive gap extending in a direction perpendicular to the first axis direction.

This transverse voltage applied across at least one non-conductive gap (such as an air gap or a vacuum for a vacuum-sealed package) introduces an electric field across the resonator body, which shifts the frequency of the parasitic vibration modes. The voltage applied can be selected so that the parasitic modes are separated in frequency from the main vibration mode as part of the design of the resonator, or there can be a feedback control circuit so that the voltage is variable.

The means to apply a voltage can comprise a counter-electrode placed in a direction perpendicular to the first axis direction from the resonator body, and a voltage source for applying a voltage between the resonator body and the counter-electrode. The counter-electrode can be over the resonator body, or it can be part of a carrier substrate beneath the resonator body. Alternatively, the counter-electrode can be placed sideways.

If a feedback circuit is used, it can have as input the electrical output signal. Thus, analysis of the electrical signal can be used to detect the amplitude clipping which is indicative of energy being wasted into the parasitic modes. The feedback circuit can instead comprise means for measuring a vibration transverse to the first axis direction. In this way, the parasitic mode vibration is more directly measured, for example using a capacitance sensor.

The resonator can comprise a MEMS resonator.

In one example, the resonator body comprises a pair of arms which extend along the first axis direction, with a head at each end of the pair of arms, wherein the means to apply a voltage comprises a first electrode on one side of one head or first pair of electrodes on opposite sides of the one head, transverse to the first axis direction, and a second electrode on one side of the other head or a second pair of electrodes on opposite sides of the other head, transverse to the first axis direction.

The actuation electrodes are then at the ends of the heads positioned along a central axis in the first axis direction of the resonator.

The invention also provides a method of controlling a resonator which comprises a resonator body and an actuation electrode for driving the resonator into a resonant mode, in which the resonator body vibrates parallel to a first axis, the method comprising:

applying a bias voltage to the resonator body, using at least one bias electrode (86) separated from the resonator body by a non-conductive gap extending in a direction perpendicular to the first axis direction;

detecting the vibration in the first axis direction; and generating an electrical output signal derived from the vibration.

Examples of the invention will now be described with reference to the accompanying drawings, in which.

MEMS resonators are designed such that an actuation signal excites one of the resonator's eigenmodes.

Figure 1:
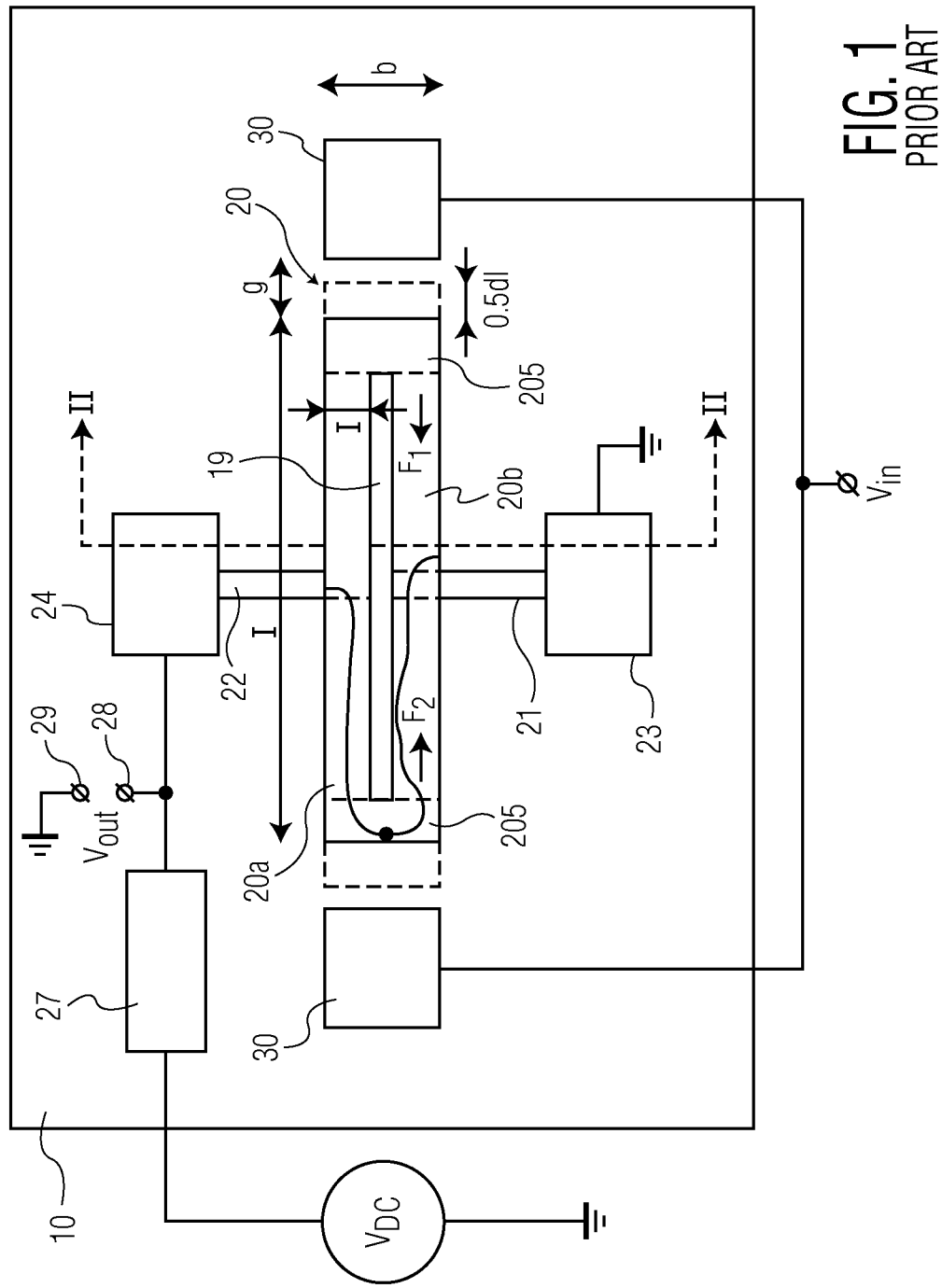
FIG. 1 shows a known resonator.

FIG. 1 shows a resonator designed to vibrate in a length-extensional mode when an ac actuation voltage is applied. If properly designed, the actuation signal does not excite other modes (like bending modes or torsion modes in this example).

The design shown in FIG. 1 is a known piezoresistive MEMS resonator, which is described in more detail in WO 2004/053431.

The resonator 1 shown in FIG. 1 comprises a substrate 10 which is a silicon wafer. Alternatively, the substrate 10 may be a gallium arsenide wafer or it may comprise any other semiconducting, metal or dielectric material. For resonators 1 designed for operation at frequencies above 10 MHz it is advantageous to use a substrate 10 comprising a dielectric such as, e.g. glass, because this reduces the loss of electromagnetic energy dissipated in the substrate.

The resonator 1 further comprises an electrically conductive resonator element 20 having two parallel connecting elements 20a,20b. The resonator extends in a longitudinal direction having a length l along a first axis which is the axis along which the intended vibrations arise, for operation in bulk mode. It is attached to the substrate 10 via support elements 21 and 22 which are connected to anchor elements 23 and 24, respectively. The anchor elements 23 and 24 are affixed to the substrate 10. The resonator element 20 and the support elements 21 and 22 are free from the substrate 10 except for the connection via the anchor elements 23 and 24.

Figure 2:
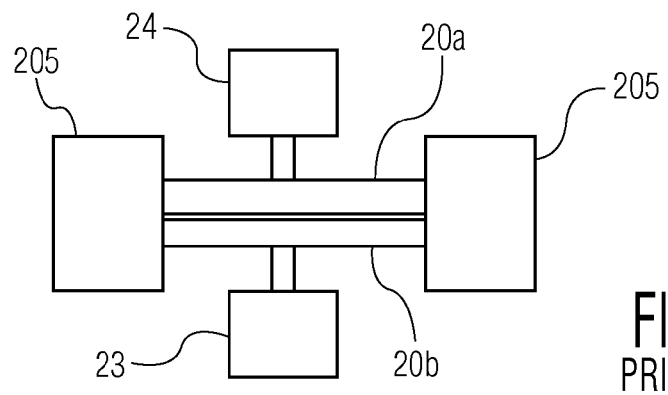
FIG. 2 shows a modification to the resonator design of FIG. 1.

The resonator element 20 has two outer ends 205 in the longitudinal direction. These can be larger than the combined width of the connecting beams 20a,20b and spacing 19 to define wider resonator masses at the ends, and thereby define a so-called dog-bone shape. This is shown in FIG. 2.

Referring back to FIG. 1, each of the outer ends 205 is faced by a respective electrode of the electrically conductive actuator 30, and is spaced from the electrode by an actuation gap g. The actuators can be considered to be gate terminals, in that the control input is applied to these terminals. The actuator 30 is able to receive an actuation potential difference $V_{IN}$ with respect to the resonator element 20 for elastically deforming the resonator element 20, using the electrostatic force. The actuation potential difference is a function of the input signal applied to the resonator 1. In addition to the input signal the actuation potential difference may typically further contain a DC component. The elastic deformation comprises a change of the length l by an amount dl shown in FIG. 1.

A feedback system controls the frequency of the actuation voltage, and the feedback loop stabilises at resonance with the actuation voltage frequency the same as the physical resonant frequency of the resonator.

The resonator element 20 is part of an oscillator circuit which is able to conduct an electrical current through the resonator element 20. The resonator element 20 is electrically connected to the positive or negative pole of a DC voltage source $V_{DC}$ via an auxiliary resistor 27, the anchor element 24 and the support element 22. The anchor 24 can be considered to be a drain terminal in that the DC voltage bias is applied to this terminal to drive a bias current through the device. The resonator element 20 is further connected to ground via the support element 21 and the anchor element 23. The anchor 23 can be considered to be a source terminal in that the bias current is collected at this terminal. Therefore, the resonator element 20 is able to conduct an electrical current I. It constitutes a resistor with an ohmic resistance R which causes a voltage drop V when the resonator element 20 conducts the electrical current I.

The resonator element 20 constitutes a resistor with an ohmic resistance R which is a function of the change dl of the length l because the resonator element 20 comprises a central part 19 with open space. The resonator element 20 comprises the two mutually parallel beams 20a,20b each of which is affixed to a respective support element 21 and 22. The two beams are connected with each other at the two outer ends by elements 205. The central part 19 has been created during a lithography step and etching step. It prevents the current from flowing from the support element 22 to the support element 21 in a straight line. The current has to follow the conductive path formed by the resonator element 20. This conductive path extends in the longitudinal direction.

The circuit is able to produce an output signal which is a function of the change dl of the length l and which is a function of the resistance R. To this end the circuit comprises a measurement point 28 which is electrically connected to the circuit. It is situated between the auxiliary resistor 27 and the anchor element 24, and in operation it produces an electrical output signal which is the electrical potential difference Vout between the measurement point 28 and the reference point 29 which is connected to ground.

In an alternative embodiment, not shown, the auxiliary resistor 27 is not situated between the voltage source and the anchor element 24, but instead between the anchor element 23 and ground. In this case the measurement point 28 is situated between the auxiliary resistor 27 and the anchor element 23.

In yet another embodiment, not shown either, the DC voltage source $V_{DC}$ and the auxiliary resistor 27 are omitted. The anchor element 24 is connected to the positive pole of a current source and the anchor element 23 is connected to the negative pole of the current source. The measurement point 28 is situated between the positive pole of the current source and the anchor element 24, and the reference point 29 is situated between the anchor element 23 and the negative pole of the current source. Thus, a voltage is measured for a constant current, or else a current portion is measured for a constant total voltage.

The output signal is again a function of the change dl of the length l as will be understood by those skilled in the art. Thus, sensing using current bias or voltage bias can be employed.

The resulting mechanical resonance is in-plane of the drawing and is symmetrical. As mentioned above, the left and right parts of the resonator can be enlarged to define masses of relatively larger stiffness than the intermediate beams, so the compression and expansion that cause the resonator-vibration occurs in the beams.

Since the mechanical vibration is symmetrical, the centre of the structure between the drain and source 24,23 remains mechanically fixed as well.

The so called actuation-gap on each side is located between the gate electrodes 30 and the resonator mass and is in the order of a few hundred nm.

The resonator may be manufactured using a technique well known in the field of micro electromechanical systems (MEMS).

Figure 3:
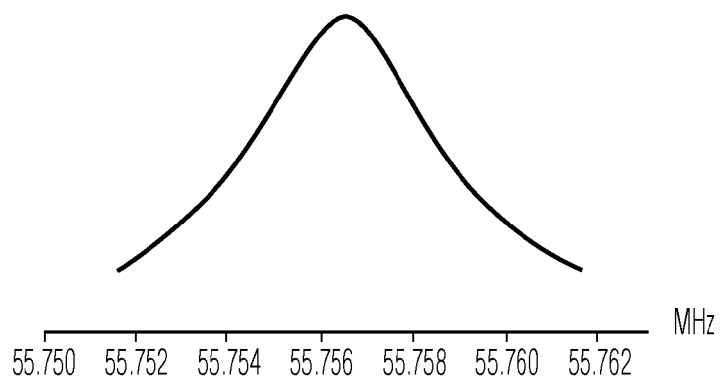
FIG. 3 shows the amplitude vs. frequency characteristics for the resonator of FIG. 2.

A plot of the vibration amplitude versus the actuation frequency is shown in FIG. 3. As shown, the resonator has a vibration amplitude which has a peak at a specific resonant frequency.

Figure 4:
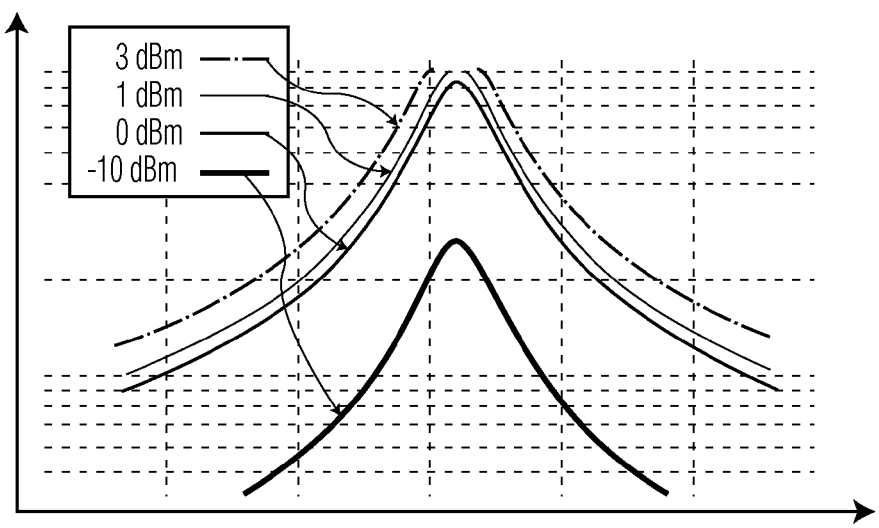
FIG. 4 shows how the amplitude vs. frequency characteristic can become clipped.

Ideally, the MEMS resonator is a purely linear device: if the actuation voltage doubles then the vibration amplitude doubles. Unfortunately, amplitude saturation is observed, meaning that the peak of the vibration amplitude peak is limited to a fixed level. This is shown in FIG. 4, which shows the amplitude plots of FIG. 3 (vibration amplitude vs. actuation frequency) for different actuation voltages. The actuation level is expressed in dBm, providing a measure of signal power.

For the larger actuation voltages, the capping can be seen.

This undesired saturation effect has been reported from groups all over the world and hinders successful use of MEMS resonators for oscillator and filter applications.

The origin of this amplitude saturation has only very recently been revealed. If its vibration amplitude is above a particular threshold, the length-extensional vibration excites another eigenmode (or a combination of eigenmodes), which will be referred to as a parasitic mode.

The parasitic mode drains energy from the desired length-extensional mode. An increase in actuation amplitude does not lead to an increased amplitude of the desired mode, but rather to an increase of amplitude of the parasitic mode. This effect is called autoparametric resonance and is discussed in C van der Avoort et al "*Amplitude saturation of MEMS resonators explained by autoparametric resonance*" 2010 J. Micromech. Microeng. 20 105012.

The measurements in this paper show that the parasitic modes involved are bending or torsion modes or combinations of them. In either of these modes there is a transversal (i.e. out-of-plane) vibration component.

Furthermore, it is shown that the energy drainage due to autoparametric resonance occurs even for relatively small length-extensional vibration amplitudes if the operation frequency of the resonator (i.e. the actuation frequency) exactly matches the eigenfrequency of the parasitic mode. Thus, under the circumstance that there is an exact frequency match, the MEMS resonator does not meet the demand of having a non-distorted large amplitude output signal.

Figure 5:
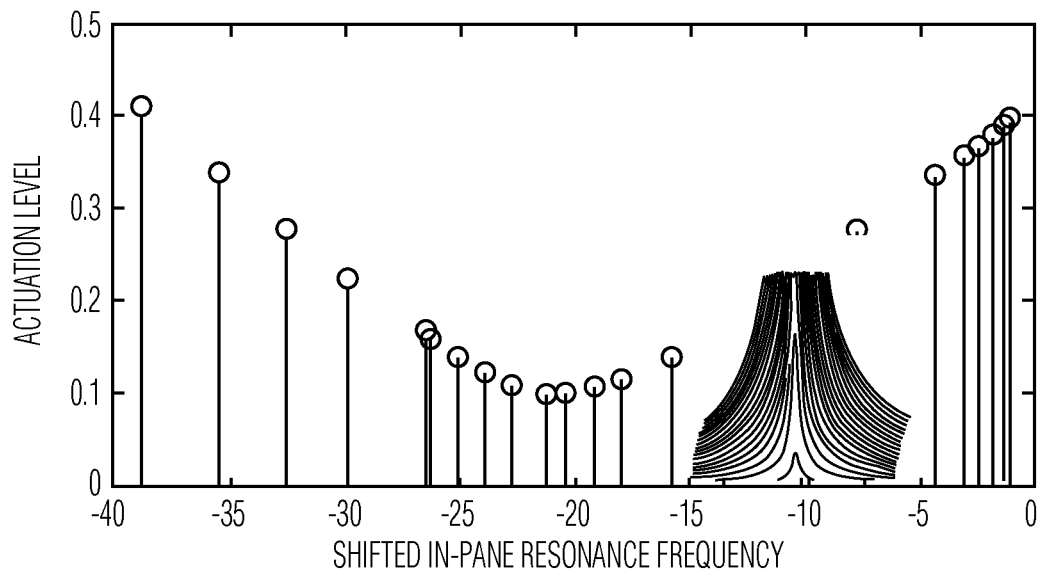
FIG. 5 shows how the maximum amplitude depends on frequency, as a result of other vibration modes at different frequencies.

When the actuation frequency is slightly shifted, the amplitude saturation occurs for a substantially larger length-extensional vibration amplitude. This is shown in FIG. 5, which illustrates the maximum vibration amplitude (i.e. the amplitude at which saturation occurs) versus actuation frequency for a particular eigenmode. The x-axis plots the frequency difference compared to the operating frequency, in units of kHz. At frequency x=−10, i.e. 10 kHz below the operating frequency of the principal mode, a superimposed series of measurements as in FIG. 4 is shown, indicating how the markers "○" in the graph are set as the maximum signal level at that frequency setting.

Thus, the frequency can be shifted to one which enables larger actuation level before the undesired capping arises.

Unfortunately, shifting the operation frequency of the resonator is not desirable since the resonance frequency of the MEMS should remain constant.

Figure 6:
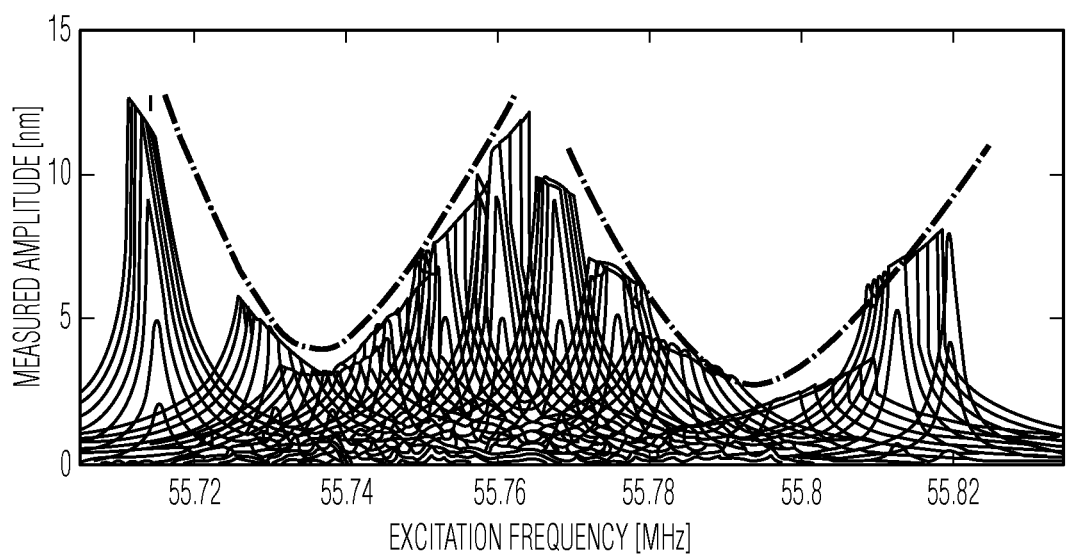
FIG. 6 shows how multiple other vibration modes at different frequencies can be present.

There are usually a variety of parasitic modes with eigenfrequencies that lead to interaction in the vicinity of the operation frequency. This is shown in FIG. 6, which shows two different eigenmodes that cause interaction in the vicinity of the operation frequency. FIG. 6 plots the maximum actuation level for different frequencies in the same way as FIG. 5. The parasitic eigenmodes cause the two troughs at around 55.74 MHz and 55.8 MHz on each side of the operation frequency around 55.76 MHz.

The invention is based on the recognition that the capping problem can be reduced by shifting the eigenfrequency of the parasitic mode away from the operation frequency of the MEMS resonator.

The invention provides a resonator comprising a resonator body and actuation electrodes for driving the resonator into a resonant mode, in which the resonator body vibrates parallel to a first axis. The resonator comprises means to apply a voltage across the resonator in a direction perpendicular to the first axis direction. This serves to shift the frequency of resonant modes other than the principal resonant mode, and this allows increased amplitude of output signal from the resonator.

The invention aims to shift the eigenfrequency of the parasitic mode away from the operation frequency of the MEMS resonator. In particular, the invention is based on shifting the eigenfrequency of the parasitic mode by applying a bias voltage in the direction of the vibration.

The governing equation for any mechanical vibration in an electric field caused by a certain biasing voltage VDC is expressed as $$w^2 = \frac{k_{eff} - k_{el}}{m_{eff}}, \text{ and } k_{el} = \frac{\varepsilon A V_{DC}^2}{g^3}. \tag{1}$$

Here $w^2$ is the so-called electro-mechanical frequency of the vibrating mode, composed of the mechanical mass and stiffness $m_{eff}$ and $k_{eff}$. It is shifted down by the $-k_{el}$ term. That term is a function of dielectric constant $\in$, frontal electrode area A, voltage $V_{DC}$ and electrode separation g.

All parasitic modes have a transversal vibration component. The invention is to apply a dc electric field in the transversal direction, such that the vibration amplitude of the resonator can be maximally increased without being saturated by autoparametric resonance.

The amplitude of the transversal field can be regulated by a feedback system such that a maximum unsaturated output signal is achieved.

The parasitic mode may comprise an out of plane vibration or an in-plane vibration perpendicular to the length-extensional vibration.

FIG. 7 shows two possible ways to counteract an out-of-plane parasitic mode, and shows a cross section through the resonator structure.

Figure 7A:
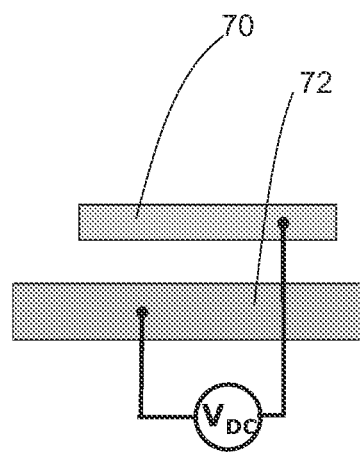
FIG. 7 shows two ways to implement a resonator of the invention.
Figure 7B:
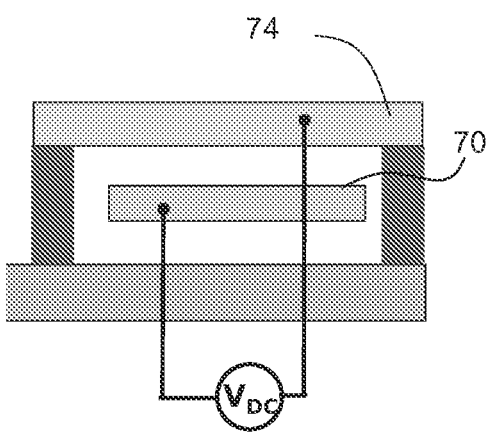

In the substrate-biased version of FIG. 7a, a voltage is applied between the resonator 70 and the substrate 72. In the electrode-biased version of FIG. 7b, a voltage is applied between the resonator 70 and a dedicated counter electrode 74 located above the resonator (although it may instead be below). The electrode can for example be located on top of a micro-cavity seal of the resonator package, and formed using thin-film technology.

The electrode 74 can be patterned so that the transversal field couples most efficiently to a particular mode.

The electric field is transverse to the desired direction of extension of the resonator in its principal resonance mode.

The topologies of FIG. 7 suppress modes with out-of-plane vibration components. If the aim is to suppress modes with sideways vibration components, an electric field can be applied by applying a voltage between the resonator and a counter electrode in the same plane as the resonator itself.

Figure 8:
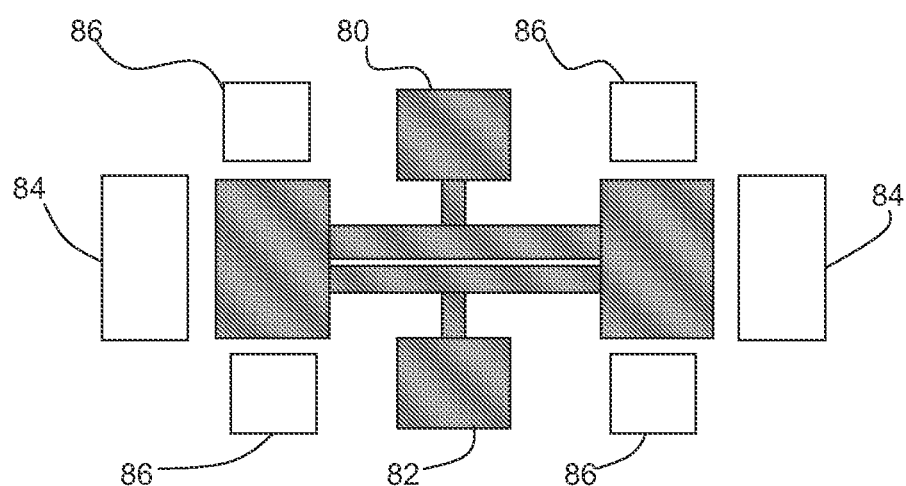
FIG. 8 shows a further way to implement a resonator of the invention.

FIG. 8 shows an example in top view. The electrode 80 is for supplying the sense current and the electrode 82 is for draining the sense current. The standard actuation electrodes are shown as 84, and the arrangement of the invention provides additional side bias electrodes 86. These are arranged transverse to the length-extension direction of the resonator, on opposite sides of the heads of the dog-bone shaped resonator.

As shown in FIG. 6, there can be a number of parasitic modes that may drain energy from the intended resonance mode. Since the eigenfrequencies of these modes are sensitive to variations in layer thicknesses, material properties and geometrical dimensions, there may be designs for which a single bias voltage cannot be found such that the eigenfrequency of the desired eigenmode is far away from eigenfrequencies of parasitic modes for all resonators to be fabricated.

Furthermore, if the operation temperature changes then the eigenfrequencies of the parasitic modes change and may come close to the eigenfrequency of the desired mode again. Therefore, it is desired to have a method to measure in use whether the resonator suffers from autoparametric resonance. A feedback circuit can then adapt the bias voltage such that the eigenfrequencies of the parasitic modes are shifted away from the eigenfrequency of the desired mode.

Figure 9:
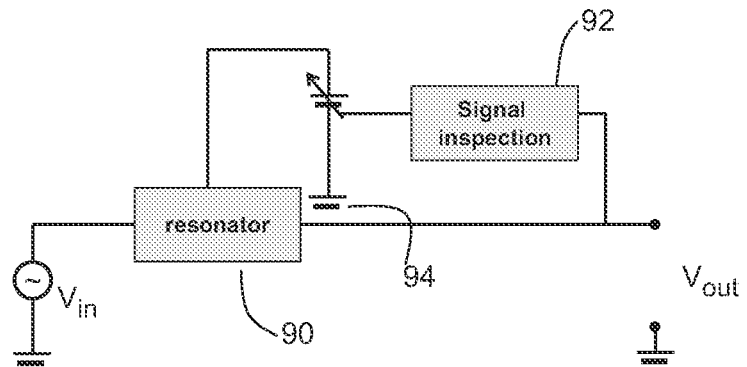
FIG. 9 shows a first example of a circuit of a resonator of the invention.

FIG. 9 shows a resonator 90 in a feedback circuit, in which a signal inspection unit 92 adapts the voltage on the mode suppression bias electrodes (86 in FIG. 8) or substrate (72 in FIG. 7a) or counter-electrode (74 in FIG. 7b) when the output signal suffers from amplitude saturation. The bias voltage source is shown as 94.

In a first approach as shown in FIG. 9, the output signal of the resonator is analysed to inspect whether the resonator suffers from autoparametric resonance. For example, in an oscillator circuit, the signal inspection unit may check the stability of the output signal amplitude. If the resonator suffers from amplitude saturation, the oscillator output signal would show a periodic amplitude variation with a period corresponding to a much lower frequency than the driving frequency of the resonator. The signal inspection unit then adapts the bias voltage such that the amplitude of this variation is minimal. In another implementation, the signal inspection unit 92 can adapt the bias voltage such that the fundamental frequency of the variation is high (this is an indication that there is a large frequency separation between the desired mode and the parasitic mode). In a third implementation the signal inspection unit can use both amplitude and frequency information of the variation.

Figure 10:
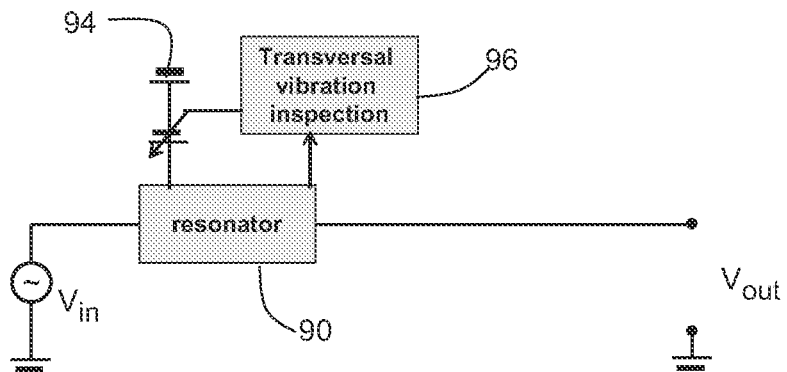
FIG. 10 shows a second example of a circuit of a resonator of the invention.

A second approach is to measure the cause of amplitude saturation: the appearance of transversal vibrations. A circuit based on this approach is shown in FIG. 10 for detecting in-plane transverse vibrations. The circuit has a transverse vibration inspection unit 96 which again controls the bias voltage applied.

The gap distance can be measured between the resonator and the bias electrode to which the mode-suppressing voltage is applied (but equally the gap to the substrate or counter-electrode can be measured for out-of-plane vibration measurement). A simple way of measuring the gap distance is by measuring the capacitance between the resonator and the bias electrode (substrate or counter-electrode).

Figure 11:
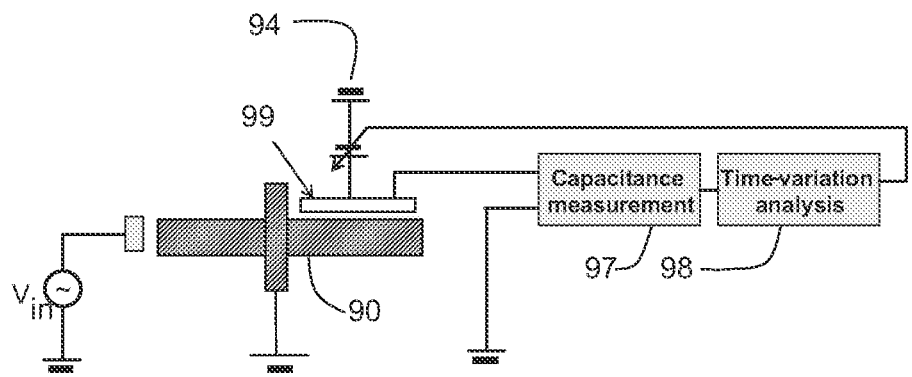
FIG. 11 shows in more detail how the circuit of FIG. 10 can be implemented.

This capacitance measurement approach is shown in more detail in FIG. 11. The transverse vibration inspection unit 96 is implemented as a capacitance measurement unit 97 and a time variation analysis unit 98. The bias voltage 94 is applied to the mode suppression bias electrode shown as 99.

The capacitance is measured in an ac fashion, and therefore there is no interference between the ac measurement signal and the dc bias signal 94 applied to suppress the parasitic modes. The time-variation analysis unit 98 analyses the capacitance measured over time. It adapts the voltage on the mode suppression electrode such that the transversal vibration is kept to a minimum. As for the example above, the unit 98 may either use amplitude information of the capacitance variation or frequency information of a combination of these.

As explained above, the invention is based on moving the parasitic modes away from the principal mode. The shift that is required is typically small. Indeed, natural variation after production already makes a large difference, and this is due to very small frequency changes. In general terms, a frequency shift of 1% is enough.

For one tested resonator geometry, shifting the frequency 20 kHz up or down, with a 56 MHz nominal frequency, makes a substantial difference. The resonator geometry tested has a combination of parasitic modes, of which one mode needs to be shifted away. Observations show that this is either a mode at 2.4 MHz, 5.2 MHz or 9.1 MHz. On average, the required frequency shift is of the order of 20 k/5M=0.4%.

This relatively small shift can be expressed as a voltage using expression (1) above.

The electrostatic stiffness $k_{el}$ has the same dimensions as the spring stiffness associated with the parasitic bending mode. For a 5 MHz resonant frequency, the corresponding value for spring stiffness can be derived of k_mech=500 N/m.

With the relative shift of 0.4%, a target value is obtained for the change in stiffness and hence a target for $k_{el}$. The voltage and the separation distance g are then related. Taking $\in=8.8\times 10^{-12}$ and a typical resonator area of 50 microns*20 microns, suitable combinations of required voltage and gap width are:

1V and 160 nm;
2V and 250 nm;
3V and 340 nm.

Thus, a bias voltage of only a few volts is needed for sub-micron gap separations.

The frequency is influenced by the mass and spring stiffness. The spring stiffness causes a force that is proportional to the position of the mass, relative to the at-rest-position. The electro-static force resulting from the lateral electric field caused by the bias voltage counter-acts this force: it is also position-dependent, but with opposite sign.

The current running through the resonator is typically 1 or 2 mA. With a resistance in the resonator of about 1 kOhm, there is a voltage drop of 1 or 2 volts over the resonator. Thus, the resonator naturally already has about up to 1 volt potential, relative to a grounded substrate. The additional biasing voltage can be only of slightly larger magnitude than this already present voltage, although larger biasing voltages can be used. The additional biasing voltage is used to generate electrostatic forces rather than to drive a current through the resonator. The bias voltage is thus preferably less than 10 volts for example less than 5 volts, and the air gap between the bias electrodes and the resonator body is preferably less than 10 microns, for example less than 1 micron. The voltage applied will depend on the parasitic modes needing to be shifted in frequency.

In the example above, the desired resonance mode is the length-extensional mode and the parasitic modes have transversal vibration components. In principle the application can be extended to any case where the undesired modes have non-zero vibration components in a direction where the desired mode has a zero vibration component. For example, if the desired mode is a z-directed bending mode, an in-plane bias voltage can be applied in the x- and/or y-direction to shift the eigenfrequency of length-extensional and y-directed bending modes, in order to suppress the effect of energy drainage into these modes.

Figure 12:
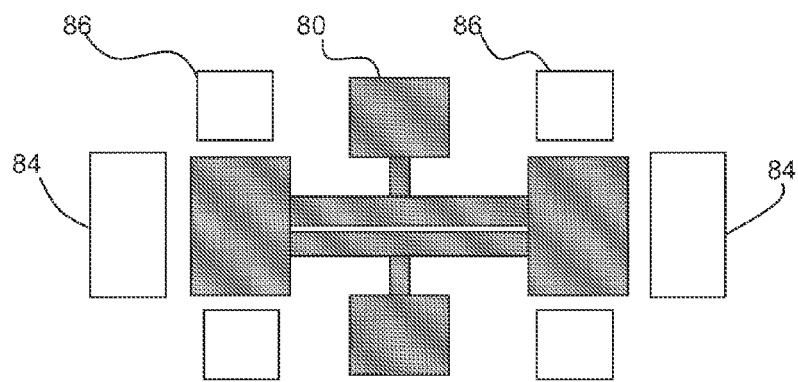
FIG. 12 shows another, example of resonator of the invention.

In the examples above using bias electrodes on the sides of the resonator head portions, there are pairs of electrodes on opposite sides of the heads. However, a single bias electrode can be provided, with a bias between the single bias electrode and the resonator body (as also in the example of FIG. 7a). FIG. 12 shows an example using single-sided biasing.

One bias electrode or set of bias electrodes can be used to adjust the frequency of one parasitic mode. However, multiple bias electrodes or sets of bias electrodes can be used, to have better control over individual parasitic modes and to enable multiple modes to be controlled independently.

Figure 13:
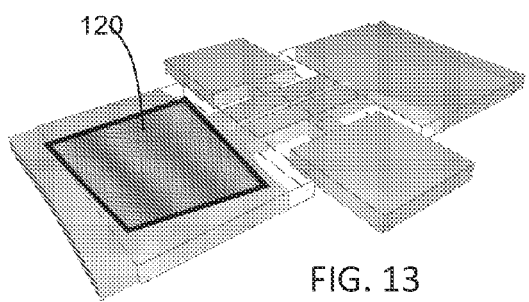
FIG. 13 shows another example of resonator of the invention.
Figure 14:
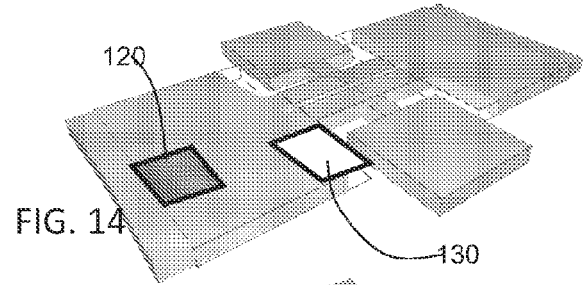
FIG. 14 shows another example of resonator of the invention.

In FIG. 13, there is one large bias electrode 120 placed above the head of the resonator, for shifting a parasitic bending mode. In FIG. 14 an example is shown with two bias electrodes placed above the resonator. One electrode 120 is for shifting a bending mode and the other 130 is for shifting a torsion mode.

Figure 15:
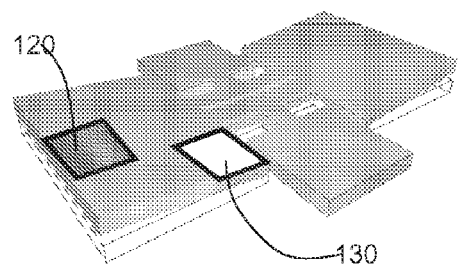
FIG. 15 shows a bending mode movement applied to the design of FIG. 14.
Figure 16:
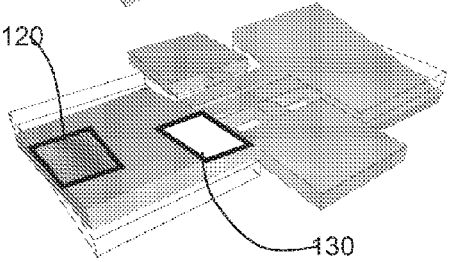
FIG. 16 shows a torsion mode movement applied to the design of FIG. 14.

The bending mode is shown in FIG. 15 with a resonant frequency exactly at the operation frequency. The torsion mode is shown in FIG. 16, and it is assumed to have a slightly higher operation frequency. The bending mode limits the amplitude as result of the frequency match, and a bias voltage can be used to shift it to lower frequency. If there is only one large bias electrode, as in FIG. 13, the torsion mode will also shift down in frequency, and this may cause the torsion mode then to limit the amplitude of the principal vibration mode.

In the double bias electrode configuration of FIG. 14, a bias can be applied only to electrode 120. This will have a strong impact on the bending mode, while the torsion mode will hardly be affected (since the electrode 120 is along the axis about which deformation due to torsion takes place). Thus, the bending mode will be shifted away, while the torsion mode remains at a safe frequency distance.

Each of the biasing electrodes 120,130 will require its own bias voltage. In a feedback circuit, both bias voltages are then controlled. This can be applied to the feedback topology of FIG. 9, but an implementation based on the feedback topology of FIGS. 10 and 11 is more straightforward. The transverse vibration at the location of a particular biasing electrode is detected, and the voltage of that electrode is then adjusted.

Thus, the invention is not limited to a single bias electrode design for one parasitic mode.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A resonator comprising:
    a resonator body;
    an actuation electrode that is configured to drive the resonator into a resonant mode in which the resonator body vibrates parallel to a first axis; and
    a detection arrangement that is configured to detect the vibration in the first axis direction and generate an electrical output signal derived from the vibration, wherein the resonator comprises an element configured to apply a bias voltage to the resonator body, using at least one bias electrode separated from the resonator body by a non-conductive gap extending in a direction perpendicular to the first axis direction, wherein the application of the bias voltage shifts an eigenfrequency of a parasitic mode.

2. The resonator as claimed in claim 1, wherein the element configured to apply the bias voltage further comprises:
    a counter-electrode placed in a direction perpendicular to the first axis direction from the resonator body; and
    a voltage source that is configured to apply a voltage between the resonator body and the counter-electrode.

3. The resonator as claimed in claim 1, wherein the element configured to apply the bias voltage further comprises:
    a voltage source that is configured to apply a voltage between the resonator body and a carrier substrate beneath the resonator body.

4. The resonator as claimed in claim 1, wherein the element configured to apply the bias voltage is configured to apply a constant voltage.

5. The resonator as claimed claim 1, wherein the element configured to apply the bias voltage further comprises:
    a feedback circuit that is configured to regulate the bias voltage.

6. The resonator as claimed in claim 5, wherein the feedback circuit has as input the electrical output signal.

7. The resonator as claimed in claim 5, wherein the feedback circuit further comprises:
    an element that is configured to measure a vibration transverse to the first axis direction.

8. The resonator as claimed in claim 7, wherein the element that is configured to measure a vibration further comprises:
    a capacitance sensor.

9. The resonator as claimed in claim 1, wherein the resonator is a MEMS resonator.

10. The resonator as claimed in claim 9, wherein the resonator body further comprises:
    a pair of arms which extend along the first axis direction, with a head at each end of the pair of arms, and wherein the element configured to apply the voltage further comprises:
    a first electrode on one side of one head or a first pair of electrodes on opposite sides of the one head, transverse to the first axis direction; and
    a second electrode on one side of the other head.

11. The resonator as claimed in claim 10, wherein the actuation electrodes are at the ends of the heads positioned along a central axis in the first axis direction of the resonator.

12. A method of controlling a resonator which comprises a resonator body and an actuation electrode for driving the resonator into a resonant mode, in which the resonator body vibrates parallel to a first axis, the method comprising:
    applying a bias voltage to the resonator body, using at least one bias electrode separated from the resonator body by a non-conductive gap extending in a direction perpendicular to the first axis direction, wherein the application of the bias voltage shifts an eigenfrequency of a parasitic mode;
    detecting the vibration in the first axis direction; and
    generating an electrical output signal derived from the vibration.

13. The method as claimed in claim 12, further comprising:
    controlling the voltage based on analysis of the electrical output signal, thereby to minimize parasitic vibrations perpendicular to the first axis direction.

14. The method as claimed in claim 12, further comprising:
    controlling the voltage based on detecting a position of the resonator body, thereby to minimize parasitic vibrations perpendicular to the first axis direction.

15. The method as claimed in claim 14, further comprising:
    measuring a capacitance between the resonator body and a bias electrode to detect the position of the resonator body.

* * * * *